(12) United States Patent
Wang et al.

(10) Patent No.: US 6,837,975 B2
(45) Date of Patent: Jan. 4, 2005

(54) ASYMMETRIC ROTATING SIDEWALL MAGNET RING FOR MAGNETRON SPUTTERING

(75) Inventors: Wei D. Wang, San Jose, CA (US); Praburam Gopalraja, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/211,473

(22) Filed: Aug. 1, 2002

(65) Prior Publication Data

US 2004/0020768 A1 Feb. 5, 2004

(51) Int. Cl.[7] .............................................. C23C 14/35
(52) U.S. Cl. ......................... 204/298.22; 204/298.12; 204/198.18; 204/298.2; 204/298.21
(58) Field of Search ........................ 204/298.12, 298.16, 204/298.17, 298.18, 298.2, 298.21, 298.22

(56) References Cited

U.S. PATENT DOCUMENTS

| | | | | |
|---|---|---|---|---|
| 5,417,833 A | | 5/1995 | Harra et al. ............. | 204/298.2 |
| 5,660,744 A | | 8/1997 | Sekine et al. .......... | 219/121.43 |
| 6,217,716 B1 | | 4/2001 | Lai ........................ | 204/192.12 |
| 6,251,242 B1 | * | 6/2001 | Fu et al. ................ | 204/298.19 |
| 6,277,249 B1 | * | 8/2001 | Gopalraja et al. ..... | 204/192.12 |
| 6,352,629 B1 | | 3/2002 | Wang ...................... | 204/298.2 |
| 6,406,599 B1 | | 6/2002 | Subramani et al. .... | 204/298.09 |
| 6,436,251 B2 | * | 8/2002 | Gopalraja et al. ..... | 204/298.12 |
| 6,444,104 B2 | * | 9/2002 | Gopalraja et al. ..... | 204/298.13 |
| 6,451,177 B1 | * | 9/2002 | Gopalraja et al. ..... | 204/192.12 |
| 6,485,617 B2 | * | 11/2002 | Fu et al. ................ | 204/192.12 |
| 6,485,618 B2 | * | 11/2002 | Gopalraja et al. ..... | 204/192.17 |

FOREIGN PATENT DOCUMENTS

EP          1119017       *  7/2001

* cited by examiner

*Primary Examiner*—Rodney G. McDonald
(74) *Attorney, Agent, or Firm*—Charles S. Guenzer

(57) ABSTRACT

A magnetron system for a sputtering target having an annular vault facing the wafer to be coated and having inner and outer sidewalls and a roof. A small magnetron is positioned over the roof. A first magnet assembly having a first magnet polarity along the target axis is positioned behind the inner sidewall. A second magnet assembly having an opposed second opposed magnetic polarity is disposed in back of the outer sidewall and has magnetic strength much greater than the first magnet assembly but its strength is asymmetrically distributed about the target axis. The second magnet assembly and the roof assembly are rotated together about the target axis. The rotating asymmetric sidewall magnet assembly may also be used with a hollow-cathode target, with or without a roof magnetron.

23 Claims, 5 Drawing Sheets

ASYMMETRIC ROTATING SIDEWALL MAGNET RING FOR MAGNETRON SPUTTERING

BACKGROUND OF THE INVENTION

1. Field of the Invention

The invention relates generally to sputtering of materials. In particular, the invention relates to the magnets enhancing plasma sputtering.

2. Background Art

Sputtering, alternatively called physical vapor deposition (PVD), is widely used to deposit layers of metals and related materials in the fabrication of semiconductor integrated circuits. Conventional sputter reactors include a planar target of the metal to be sputtered in opposition to the wafer being coated. A working gas, typically argon, fills the chamber at low pressure. In DC sputtering, a negative voltage is applied to the target sufficient to discharge the argon into a plasma. The positive argon ions are attracted to the negatively biased target with sufficient energy that they sputter metal atoms from the target. Some of the sputtered metal atoms strike the wafer and coat it with a layer of the metal. In reactive sputtering, most often of metal nitrides, nitrogen, oxygen, or other reactive gas is additionally filled into the chamber. The reactive gas reacts with the sputtered metal atoms at the surface of the wafer forming a metal nitride layer on the wafer surface.

The multiple wiring levels representative of advanced integrated circuits include inter-level dielectric layers, typically of silicon dioxide or related silicate glass, separating neighboring pairs of generally horizontally extending electrical interconnects. Vias are electrical plugs extending vertically through the inter-level dielectric layers to interconnect the different wiring levels. A via is formed by etching a narrow hole through the exposed dielectric layer and then filling the holes with the metallization after a proper barrier or seed layer has been coated onto the sidewalls and bottom of the via hole. The increased capacity of advanced integrated circuits is achieved in large part by shrinking the horizontal dimensions of its elements. The minimum width of vias is being pushed to 0.18 $\mu$m and below. A minimum width of 0.07 $\mu$m is being planned for the not too distant future. However, for a number of reasons, the thickness of the inter-level dielectric layers needs to be at least about 0.7 $\mu$m thick and may be even more for some complex structures. The result is that the aspect ratio of via holes is being pushed to above 5 for current products, and an aspect ratio of 10 or even higher is contemplated.

Sputtering has long been used to sputter aluminum for horizontal interconnections and to simultaneously fill via holes extending between metallization levels. Special sputtering techniques have been developed to deposit thin layers into narrow and deep vias to act as barrier and seed layers. Typical barrier materials include titanium, tantalum, tungsten, and their nitrides, all of which can be sputtered. Silicidation metals can also be sputtered. These layers need be only a few nanometers thick, but they must coat the sides of the via holes, a difficult but achievable process in sputtering. Copper is replacing aluminum in advanced integrated circuits for the metallization materials. Although most of the copper is deposited by electrochemical plating (ECP), a thin copper seed layer is required to initiate the ECP growth and to provide a plating electrode. Again, the copper seed layer must coat the side of the via holes.

Sputtering into high aspect-ratio holes is a difficult task since the sputtering produces an approximately isotropic sputtering pattern. One general technique causes a large fraction of the sputtered metal atoms to be ionized. A negative electrical bias is applied to the pedestal electrode supporting the wafer being sputter coated to accelerate the metal ions to a high perpendicular velocity so that they penetrate deeply within high aspect-ratio holes.

Several types of plasma sputter reactors have been developed which enable a high metal ionization fraction. One such reactor is the SIP$^{+}$™ reactor available from Applied Materials, Inc. of Santa Clara, Calif. Gopalraja et al. describes an initial design in U.S. Pat. No. 6,277,249. A more complete design is described by Gopalraja et al. in U.S. patent application Ser. No. 09/703,601, filed Nov. 1, 2000, and by Subramani et al. in U.S. Pat. No. 6,406,599. The latter two references are incorporated here by reference in their entireties. The SIP$^{+}$ reactor, which will be described in detail later, includes a complexly shaped target having an annular vault facing the wafer. The vault includes inner and outer sidewalls and a roof bridging the sidewalls.

The technology incorporated into the SIP$^{+}$ reactor derives many of its advantages from the strength and shape of magnets placed behind the vault sidewalls and roof. However, the high magnetic intensities introduce their own complexities and artifacts, which need to be controlled and in some cases compensated. Producing uniform sputter deposition is a challenge when the annular vaulted target and its magnetrons are distinctly non-uniform in the radial direction. Although remarkable process results have been achieved, further improvements are desired.

SUMMARY OF THE INVENTION

A magnetron sputter reactor includes a complexly shaped target including at least one sidewall symmetric about a central axis and surrounding a vault facing the substrate to be sputter coated. An asymmetric magnet ring positioned in back of the sidewall and rotatable about the central axis has a greater magnetic strength on one side of the vault than on the azimuthally opposed side.

In one aspect of the invention, the target includes inner and outer sidewalls and a roof defining an annular vault surrounding the central axis. A inner magnet assembly of a first vertical magnetic polarity is positioned in back of the inner sidewall. An asymmetric outer magnet assembly of an opposed second vertical magnetic polarity is positioned in back of the outer sidewall. The magnetic intensity of the ring varies from one side to the other, preferably in a smooth variation having one minimum and one maximum. The total magnetic intensity of the asymmetric outer magnet assembly is much greater than that of the inner magnet assembly. The outer magnetic assembly is rotated about the central axis to provide time-averaged uniformity. A roof magnet assembly may be positioned in back of the roof and may be a nested magnet assembly including an inner pole of the first magnetic polarity surrounded by an outer pole of the second magnetic polarity, preferably with the outer pole being much stronger than the inner pole. The outer and roof magnet assemblies are rotatable together about the central axis. Preferably, the weaker portion of the outer magnet assembly is positioned on an opposite side of the central axis form the roof magnet assembly.

In another aspect of the invention, the target is a hollow-cathode target including a single sidewall and a roof defining a right cylindrical vault surrounding the central axis. An asymmetric magnet assembly is positioned in back of the sidewall and rotates about the central axis. Optionally, a roof magnetron may be positioned in back of the roof. It may be a small nested magnet assembly rotatable about the central axis together with the asymmetric magnet assembly.

DETAILED DESCRIPTION OF THE PREFERRED EMBODIMENTS

Figure 1:
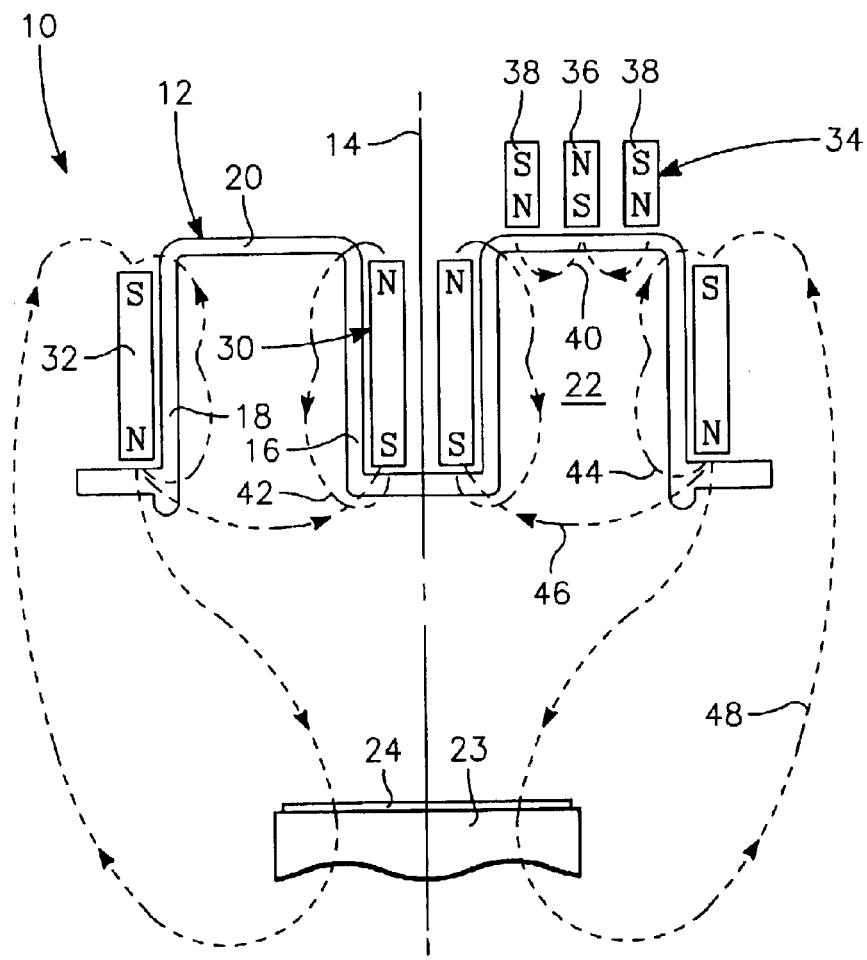
FIG. 1 is a schematic cross-sectional view of a magnetron sputter reactor having a target shaped with an annular vault, unbalanced sidewall magnetrons, and a rotating roof magnetron, and including the magnetic field distribution produced by the magnetrons.

An SIP+ magnetron sputter reactor 10 is illustrated in the schematic and partial cross-sectional view of FIG. 1. A more detailed view of the reactor of the invention will be presented later. The reactor 10 includes a vault-shaped target 12 arranged about a central axis of the reactor 10. The target 12 includes an inner sidewall 16 and an outer sidewall 18 both extending substantially parallel to the central axis 14 and a roof 20 bridging the upper ends of the sidewalls 16, 18. The sidewalls 16, 18 and roof 20 form an annular vault 22 in the target 12 which faces a pedestal 23 supporting a wafer 24 to be sputter coated with material from the target 12.

Several magnet assemblies form the overall magnetron of the SIP+ reactor. An inner sidewall magnetron includes a cylindrical inner magnet assembly 30 of one or more magnets arranged radially inwardly of the inner sidewall 16 and having a first magnetic polarity along the central axis 12. An outer sidewall magnetron includes a tubular outer magnet ring 32 of preferably many magnets arranged in a ring radially outwardly of the outer sidewall 18 and having a second magnetic polarity opposite the first magnetic polarity. In the version of the SIP+ reactor described by Gopalraja et al. and Subramani et al., the outer magnet ring 32 is generally circularly symmetric and is stationary. The inner magnet assembly 30 is also generally circularly symmetric although composed of a circular array of cylindrical magnets. Nonetheless, it rotates for reasons associated with cooling. Advantageously, the total magnetic intensity of the outer magnetic ring 32 is much greater than that of the inner magnetic assembly 30. The total magnetic intensity equals the surface integral of the magnetic flux density on either the top or bottom end faces of the magnetic assemblies 30, 32. Preferably, the ratio between the magnetic intensities of the outer magnetic ring 32 and the inner magnetic assembly 30 is at least four and is sometimes approximately six in operational reactors. A small nested roof magnetron 34 is positioned over a portion of the target roof 20 and includes an inner pole 36 of the first magnetic polarity surrounded by a much stronger annular outer pole 38 of the second magnetic polarity. The ratio of magnetic strengths of the outer pole 38 to the inner pole 36 is preferably at least 1.5.

The roof magnetron 34 produces a semi-toroidal magnetic field 40 on the adjacent portion of the roof 20. This magnetic field is very strong and creates a very high plasma density in that portion of the roof 20, thereby increasing the sputtering rate and increasing the fraction of sputtered metal atoms that are ionized. That is, the metal ionization fraction is relatively high. The roof magnetron 34 is rotated along the back of the roof 20 over the azimuthal length of the vault 22 so that its magnetic field at any one time is concentrated over a small area of the roof 20 but is averaged over time between different portions of the roof 20.

The inner sidewall magnet assembly 30 produces an inner sidewall magnetic field component 42 that extends generally parallel to the inner sidewall 16, and the outer sidewall magnet ring 32 produces an outer sidewall magnetic field component 44 that extends generally parallel to the outer sidewall 18 but with an opposite direction from that of the inner sidewall magnetic field component 42. Both the sidewall magnetic field components 42, 44 increase the plasma density on the associated sidewalls 16, 18 and also guide metal ions out of the vault 22. Since the sidewall magnetrons are unbalanced, a bridging magnetic field component 46 between the two sidewall magnet assemblies 30, 32 closes the mouth of the vault 22. Further, the stronger outer sidewall magnet ring 32 produces a looping magnetic field component 48 which projects from its lower end towards the wafer 24 while trending towards the central axis 14 before it loops back radially outwardly of the outer sidewall magnet ring 32 towards its top. The looping magnetic field component 48 guides the metal ions towards the wafer 24. In the case of a circularly symmetric outer sidewall magnet ring 32, the looping magnetic field component 48 also preferentially focuses the metal ions towards the center of the wafer 24.

Figure 2:
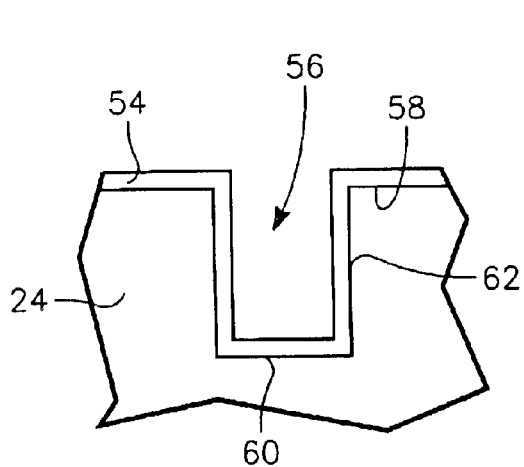
FIG. 2 is a schematic illustration of the magnetic field distribution produced by the magnetrons in the sputter reactor of FIG. 1.

Many applications benefit from a relatively high fraction of metal ions, especially as illustrated in the cross-sectional view of FIG. 2, when sputtering a film 54 into a high aspect-ratio hole 56. The wafer pedestal 23 can be biased electrically negative to accelerate the positive metal ions so that they not only strike a top planar surface 58 but also reach deep within the hole 56 to coat a bottom 60 and sidewalls 62 of the hole 56. However, a typical SIP+ reactor 10 produces an metal ionization fraction of substantially less than unity, 50% being a typical upper value for copper sputtering even when the reactor 10 is operated at high power and low pressure. As a result, there is a significant neutral component of sputtered metal atoms that are unaffected by the magnetic guiding and focusing and by the wafer biasing. The neutrals have a much more isotropic pattern at the wafer than do the accelerated metal ions. Hence, the neutrals are less effective at sputtering into deep holes. As illustrated in the cross-sectional view of FIG. 3, in some applications, a more neutral sputter population may reduce the bottom and sidewall coverage, and the sidewall coverage may tend to become non-uniform. Further, overhangs 64 may form at the top of the hole 56 which not only reduce the hole filling but, in some circumstances, may bridge the top of the hole 56 and prevent further metallization of the hole 56.

Figure 3:
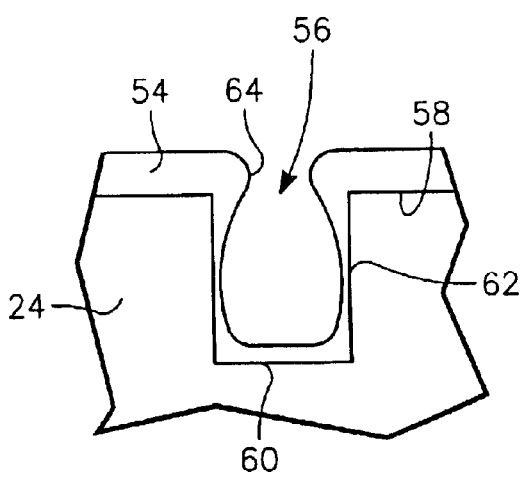
FIG. 3 is a cross-sectional view of a via hole with nearly optimal sidewall and bottom coverage with no overhang.

With the symmetric magnetic focusing illustrated in FIG. 1, at the center of the wafer 24, metal ions dominate the hole filling to produce the structure of FIG. 2; but, at the periphery of the wafer 24, metal neutrals dominate the hole filling to possibly produce the structure of FIG. 3. As a result, the magnetic focusing produced by the unbalanced sidewall magnet assemblies is advantageous but results in a non-uniform coating pattern across the wafer 24.

Figure 4:
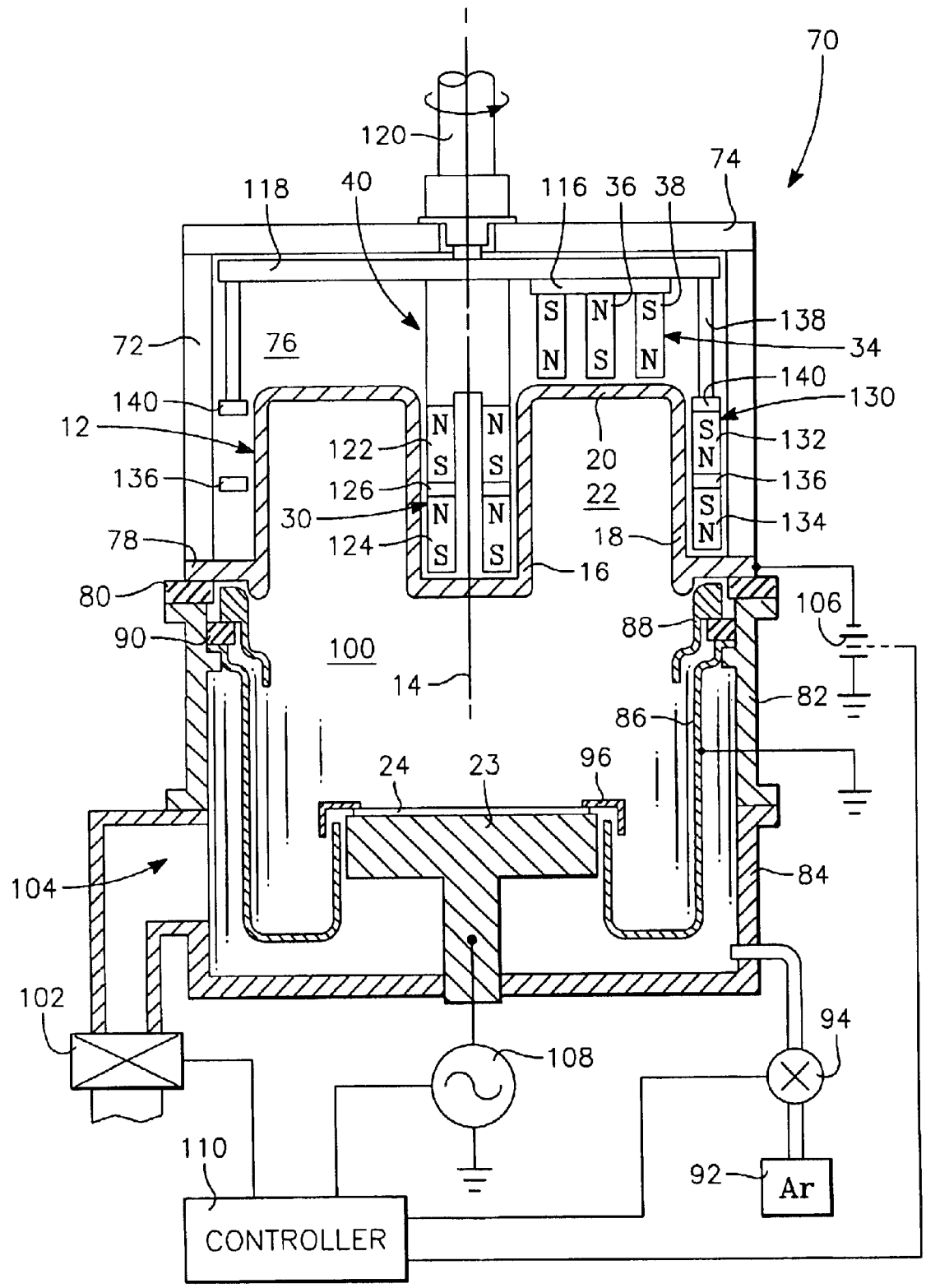
FIG. 4 is a more detailed cross-sectional view of a magnetron sputter reactor similar to that of FIG. 1 but having an asymmetric outer sidewall magnetron.

Sputtering uniformity, which is degraded by excessive focusing, can be improved by modifying the outer sidewall magnet ring 32 to be non-symmetric about the central axis 14 and then, as illustrated in the cross-sectional view of FIG. 4 for a SIP+ reactor 70, rotating the asymmetric sidewall magnet ring 130 about the central axis 24. Before the important magnet ring 130 and its support structure is discussed, the other details of the SIP+ reactor 70 will be first described.

The upper chamber of the SIP+ reactor 70 above the principal processing volume includes a cylindrical upper wall 72, which supports and is sealed to a reactor roof 74. The vault-shaped target 12 is fixed and sealed to the upper wall 72 to allow cooling water to form a bath that circulates in a space 76 in back of the target 12.

A rim 78 of the target 12 is supported through a dielectric isolator 80 on a metallic adapter 82, which in turn is supported on a lower chamber 84. The separate adapter 82 simplifies changes in the overall height of the chamber, in particular, the target-to-wafer spacing since only the simple adapter 82 needs to be reengineered rather than the more complicated lower chamber 84. A pedestal electrode 23 supports the wafer 24 to be sputter coated in opposition to the target 12. A grounded shield 86 is supported on and grounded to the adapter 82. It acts both to protect the adapter 82 and lower chamber 84 from sputter deposition and to provide a grounded anode for the sputtering plasma. An electrically floating shield 88 is supported through a second dielectric isolator 90 on the adapter 82 above the grounded shield 86 and close to the target 12. The floating shield 88 is separated from a rounded knob extending from the bottom of the outer target sidewall 18 by less than a plasma dark space, thereby preventing the plasma from reaching the isolators 80, 88. Negative electrical charge built up on the floating shield 88 repels the plasma electrons and thus reduces electron loss from the plasma near the target 12.

A sputter working gas such as argon is supplied from a gas source 92 through a mass flow controller 94 to the area in back of the grounded shield 86. It flows through a gap formed between the pedestal 23, the grounded shield 86, and a plasma ring 96 to a processing space 100 between the pedestal 23 and the target 12. The pressure in the vacuum chamber is maintained by a vacuum pump system 102 connected to the chamber in back of the grounded shield 86 through a pumping port 104 formed in the lower chamber 84. Although the chamber has a base pressure in the neighborhood of $10^{-8}$ Torr, in typical sputtering operations not involving complete sustained self-sputtering, the chamber pressure is typically held between 0.1 and 5 milliTorr.

The plasma is initiated by flowing argon into the chamber and igniting it into a plasma by supplying DC voltage from a DC power supply 106 connected to the target 12. Although a higher voltage is needed for ignition, a target voltage of about −400 to −700VDC maintains a plasma within the chamber. Especially in the case of sputtering copper, once the plasma has been ignited, the supply of argon may be reduced or even eliminated. The pedestal electrode 23 may be left electrically floating, in which case it nonetheless builds up a negative DC bias. On the other hand, the DC self-bias can be increased and controlled by applying RF power from an RF bias supply 108 to the pedestal electrode 23. The DC self-bias is effective at accelerating metal ions in the direction perpendicular to the wafer 24, thus promoting sputtering into high aspect-ratio holes. An electronic controller 110 controls the two power supplies 106, 108, the argon mass flow controller 94, and the vacuum system 102 according to the recipe developed for the desired sputtering process.

Returning now to the important magnetron parts, the magnets 36, 38 of the roof magnetron 34 are supported from and magnetically coupled by a magnetic yoke 116 carried by a support arm 118 fixed to and rotated by a rotary drive shaft 120 driven by an unillustrated motor and pulley system to rotate at about 100 rpm. The support arm 118 is preferably formed of aluminum or other non-magnetic material so it does not interfere with the magnetic field distribution. As a result of the rotation, the roof magnetron 34 is swept over the back of the target roof 20 along the azimuthal extent of the vault 22. The inner sidewall magnet assembly 30 includes a set of upper magnets 122 and a set of set of lower magnets 124 arranged in a circle. A non-magnetic spacer ring 126 separates the upper and lower magnets 122, 124 to reduce the sputtering rate of the middle portion of the inner target 16. Although the magnets 124, 126 of the inner sidewall magnet assembly 126 are arranged to be generally circular symmetric, nonetheless they are fixed to the drive shaft 120 and are rotated thereby to promote the circulation of cooling water inside the well formed between the inner target sidewall 16.

An asymmetric outer sidewall magnet ring 130, which is incompletely illustrated in FIG. 4, includes a set of upper magnets 132 and a set of lower magnets 134 arranged in back of the outer target sidewall 18 in an incomplete but otherwise generally circularly pattern. They have a magnetic polarity along the central axis opposite that of the magnets 122, 124 of the inner sidewall magnet assembly 30. A spacer ring 136 separates the upper and lower magnets 132, 134. An upper ring 136 supports the magnets 130, 132 of the outer sidewall magnet ring 32 and is in turn supported by downward extensions of the support arm 118 fixed to the drive shaft 120. As a result, the asymmetric outer sidewall magnet ring 130 is rotated around the central axis 14 in back of the target outer sidewall 18.

Figure 5:
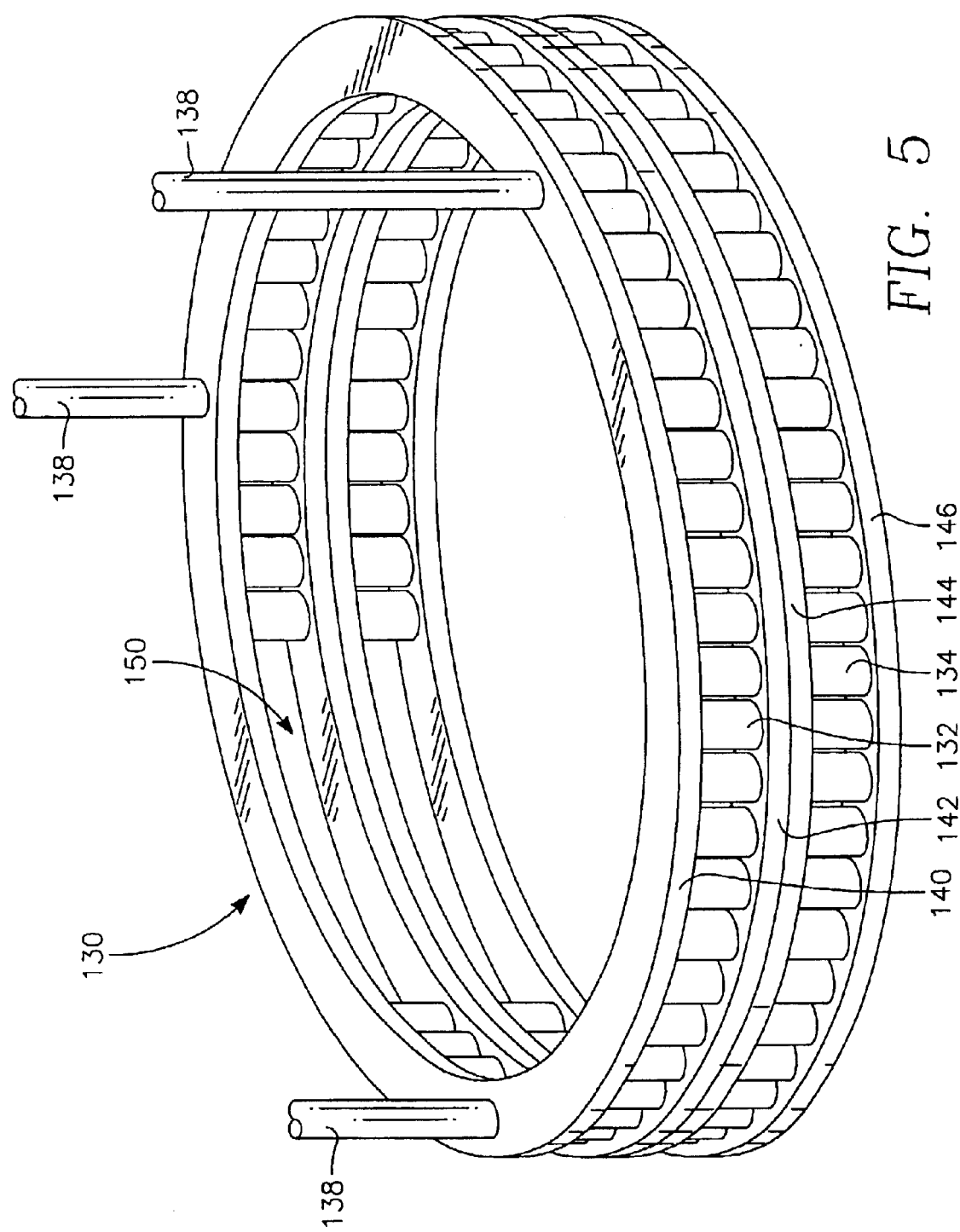
FIG. 5 is an orthographic view of an asymmetric magnetic ring usable as the outer sidewall magnetron of FIG. 4.

An example of the asymmetric magnet ring 130 is illustrated in more detail in the orthographic view of FIG. 5. The magnets 132, 134 are formed in two separate annular assemblies held between the upper ring 140, two middle rings 142, 144, which together constitute the spacer ring 136 of FIG. 4, and a lower ring 146. The upper and lower rings 140, 146 should be magnetic to act as pole faces while the middle rings 142, 144 may be either magnetic or non-magnetic depending on whether sputtering should be reduced in the center of the outer target sidewall 18. Although the magnets 132, 134 are held in the rings 140, 142, 144, 146 in a tight circular arrangement, in the asymmetric magnet ring 130, a portion 150 of the ring 130 does not contain the magnets 132, 134. For example, although the magnet ring 130 may accommodate sixty magnet pairs at equiangularly spaced locations, the magnets are not present in ten neighboring locations. Thereby, in that portion 150 lacking magnets, the magnet ring 130 produces substantially no magnetic field with the result that the magnetic strength of the magnet ring 130 varies around the ring. However, even with the removal of some of the magnets 132, 134, the total magnetic intensity of the magnet ring 130 is still substantially greater than that of the inner sidewall magnet assembly 30. The unbalance is particularly strong in the area of the magnet ring 130 where the magnets 132, 134 are present.

Figure 6:
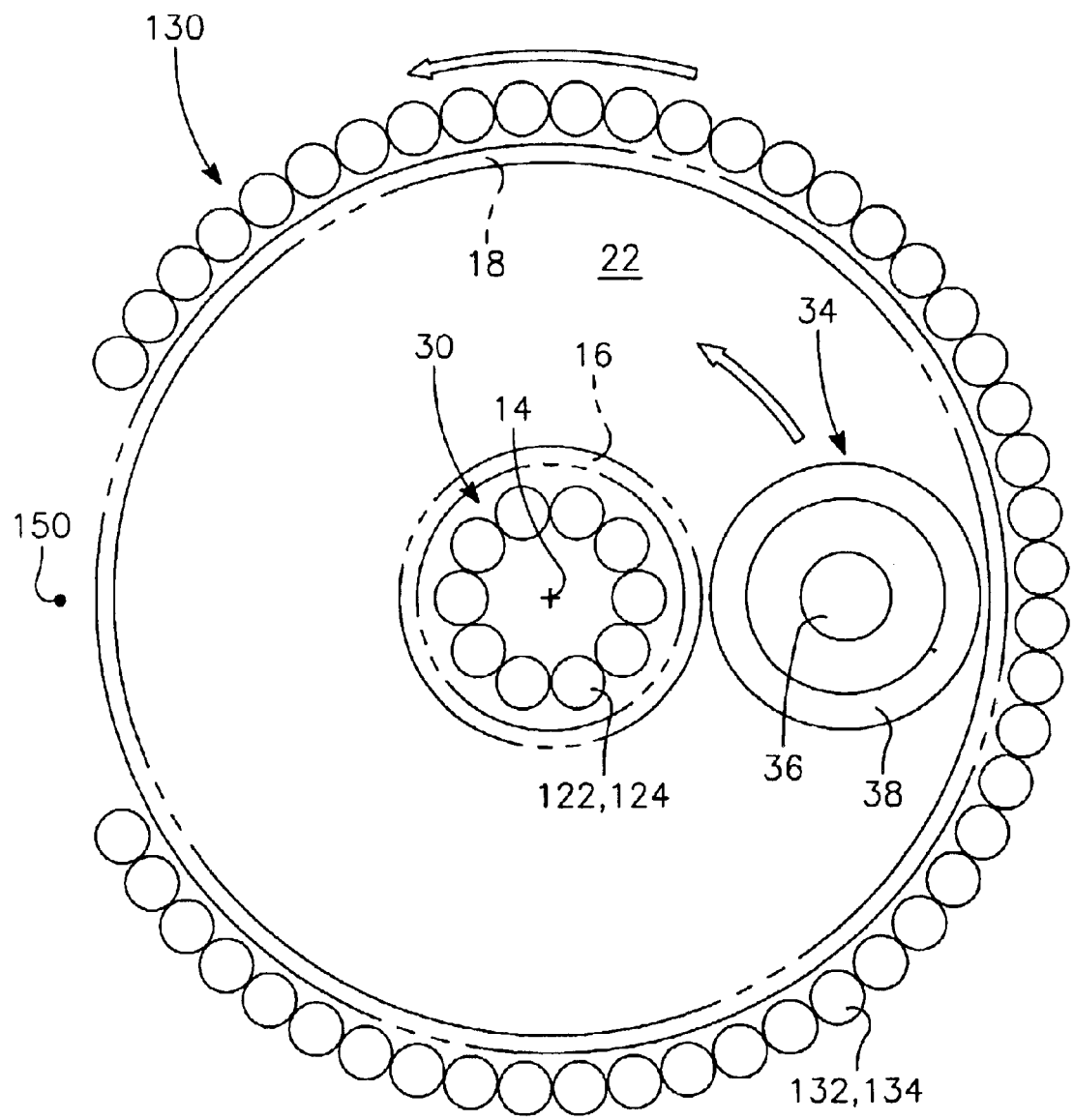
FIG. 6 is a schematic plan view of the magnetrons of FIG. 4.

A schematic plan view of FIG. 6 shows the magnetron arrangement relative to the target vault 22 represented by dashed lines. The outer sidewall magnets 132, 134 of the asymmetric magnet ring 130 are arranged in a circular band about the central axis 14 except for an arc-shaped void 150, which breaks the symmetry of the magnetic focusing resulting from the otherwise stronger outer magnet ring 130 relative to the inner sidewall magnet assembly 30. The asymmetric magnet ring 130 rotates about the central axis 14 along with the roof magnetron 34. It is believed that maximum defocusing and reduced ion loss are obtained when the void 150 of the asymmetric magnet ring 130 is located 180° about the central axis 14 with respect to the center of the roof magnetron 34. As an example, if there are ten sets of inner magnets 122, 124 and there is space for sixty sets of outer magnets 132, 134 in the magnet ring 130, five sets of outer magnets 132, 134 may be removed to create the void 150. For similar magnets, the magnetic intensity ratio is thus maintained at 5.5.

As a result, the metal ions are not so strongly focused near the central axis 14, that is, near the center of the wafer. Averaged over time, a more uniform distribution of metal ions is obtained over the radius of the wafer.

The void 150 preferably extends over no more than 90° of the circular band to maintain a significant focusing in the remaining arc portion. When the magnets 132, 134 is the remainder of the band are uniformly strong and distributed, the large lateral extent of looping magnetic field guides the metal ions towards the wafer but the void 150 allows some of the partially guided ions to be transported with incomplete focusing. Mechanical stability of the rotating asymmetric ring 130 is improved if the dummy magnets are placed in the locations of the missing magnets. A dummy magnet has generally the same form factor and weight as a real magnet 132, 134 but is not magnetized or formed of magnetic material that would interfere with the magnetic field produced by the real magnets 132, 134.

Other magnet configurations may be used to produce an asymmetric magnetic field. Only some of the magnets may be removed on the weaker side of the magnet ring 130, or they may be arranged with a gradually varying density of magnets along the ring 130. The magnetic strength of the magnets 130 may be decreased gradually or abruptly from the strong side to the weak side of the ring 130. A general definition of an asymmetric magnet ring is that the least magnetic intensity integrated over 15° of any arc portion of the ring is less than 50% of the greatest magnetic intensity of any other arc portion, thereby excluding more localized asymmetries.

The invention can also be applied to a hollow-cathode target, which has right cylindrical vault formed between a single outer sidewall and a circular roof. In its most common form, the cylindrical sidewall is surrounded by a annular and circularly symmetric magnet assembly magnetically polarized along the central axis of the vault. The magnet assembly not only produces a sidewall magnetic component inside the vault but also produces a projecting and looping magnetic component, similar to that produced by the unbalanced sidewall magnetrons of FIG. 1 and resulting in similar advantages. However, it also may result in excessive metal ion focusing near the wafer center. Accordingly, the sidewall magnetron for use with a hollow-cathode target may advantageously be made asymmetric about the center axis and rotated about it.

Figure 7:
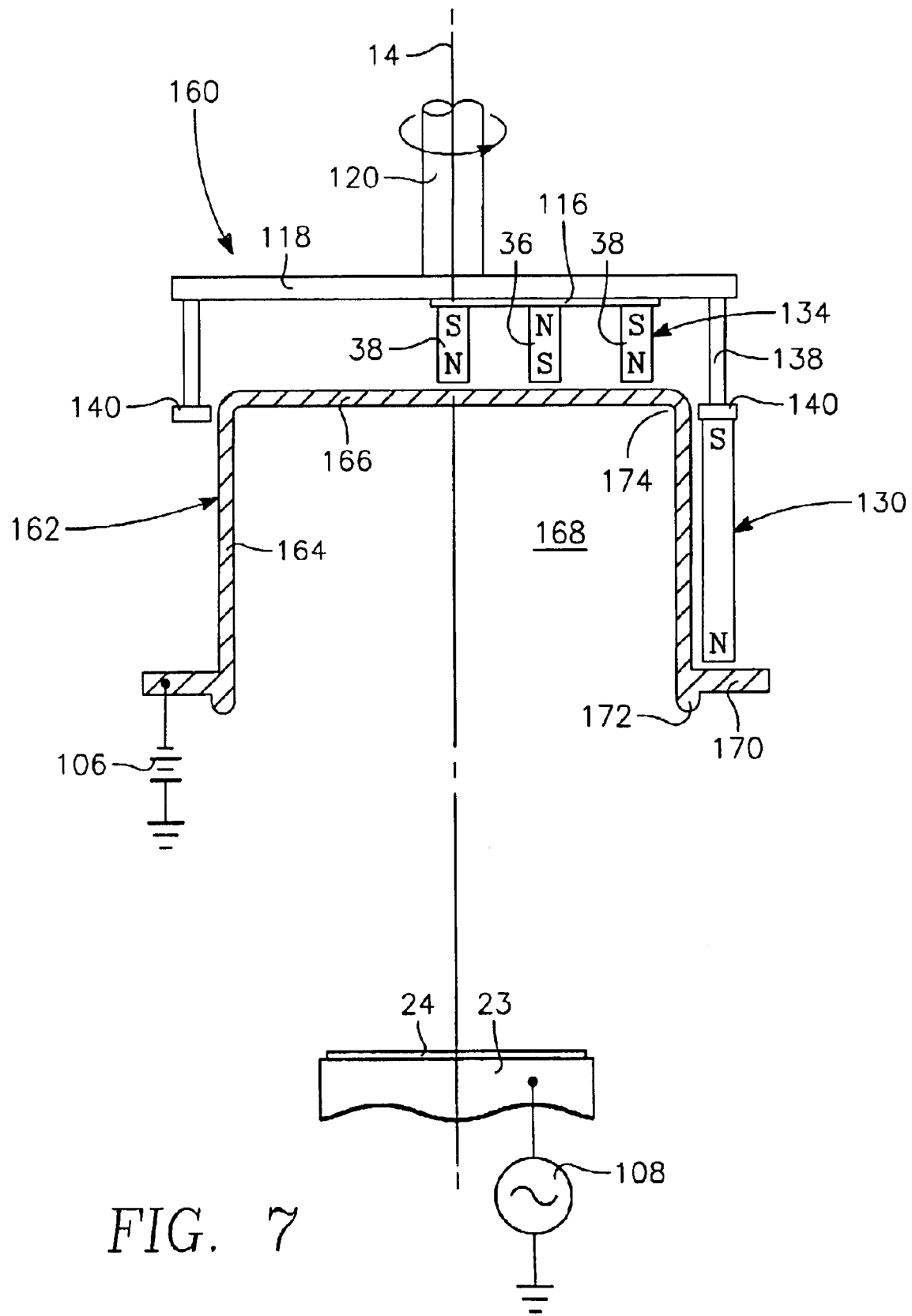
FIG. 7 is a schematic cross-sectional view of a hollow-cathode sputter reactor including an symmetric sidewall magnetron and a small roof magnetron rotating together.

As schematically illustrated in the cross-sectional view of FIG. 7, a hollow-cathode reactor 160 includes a target 162 having a single cylindrical sidewall 164 and a disk-shaped roof 166 generally circularly symmetric about the chamber central axis 14, although the roof 166 may be somewhat domed in some embodiments. The sidewall 164 and roof 166 partially enclose a generally right cylindrical vault 168 facing the wafer 24 to be sputter coated. At the bottom of the sidewall 164 are formed an outwardly extending support flange 170 and a downwardly projecting rounded knob 172 for creating a plasma dark space against the floating shield 88 of FIG. 4.

The asymmetric sidewall magnet ring 130 is disposed radially outside of the sidewall 164 and has a single magnetic polarity along the central axis 14. The asymmetric sidewall magnet ring 130 may be similar to that of FIGS. 4 and 5. Its magnetic field distribution includes a projecting and looping component. However, because of the asymmetry, the sidewall magnet ring 130 does not strongly focus the metal ions towards the central axis 14, unlike the conventional symmetric hollow-cathode sidewall magnet assembly.

The asymmetric sidewall magnet assembly 130 is supported through the upper ring 140 on the support arm 118 and its extensions 138, which are fixed to the drive shaft 120. As a result, the asymmetric sidewall magnet assembly 130 is rotated so that the defocused metal ions are azimuthally scanned about the wafer 24, thus improving the deposition uniformity.

Although not universally used, suggestions have been made for placing an asymmetric magnetron behind the hollow-cathode roof 166 and rotating it about the central axis 14. Guenzer in U.S. patent application Ser. No. 10/180, 646, filed Jun. 26, 2002, has suggested using an enlarged version of the nested roof magnetron 134 so that a high-density plasma is created over portions of the target roof 166. Since the rotating support arm 118 also supports the asymmetric roof magnetron 134, it is azimuthally scanned along with the asymmetric sidewall magnet assembly 130 to provide more uniform roof erosion and a more uniform time-averaged metal ion source. The plan view of the magnets of FIG. 7 can be visualized by slightly modifying FIG. 6 by eliminating the inner sidewall magnet assembly 30 and expanding the roof magnetron 34 inwardly towards or slightly beyond the central axis 14. Although FIG. 7 illustrates the weak side of the asymmetric sidewall magnet assembly 130 as being diametrically opposed to the roof magnetron 134, other relative angular positions are possible, as has been discussed for the annularly vaulted target.

If, as illustrated in FIG. 7, the roof magnetron 134 is adjacent the strong side of the magnet ring 130 at a corner 174 of the target and the magnet polarities are the same for the outer ring portion 38 of the roof magnetron 134 and for the magnet ring 130, then a very intense magnetic field is created in that corner 174, thus promoting sputtering of the target corner.

The invention thus combines the beneficial guiding effects which unbalanced sidewall magnetrons provides to metal ions with a more uniform wafer coverage for those metal ions.

What is claimed is :

1. A plasma sputtering target and magnetron system, comprising:
    a sputtering target having a vault generally circularly symmetric about a central axis and defined between at least a first sidewall and a roof of said target; and
    an asymmetric magnet ring composed of a plurality of magnets having a magnetic polarity in a first direction along said central axis, arranged along a circle extending radially outwardly of said first sidewall, having an asymmetric distribution of magnetic strength around said circle, and rotatable about said central axis.

2. The system of claim 1, wherein said target further includes a second sidewall radially inward of said first sidewall further defining the vault and further comprising a magnet assembly having a magnetic polarity in a second direction opposite said first direction and disposed radially inwardly of said second sidewall.

3. The system of claim 1, further comprising a magnet assembly positioned on a side of said roof opposite said vault and rotatable with said asymmetric magnet ring.

4. The system of claim 1, wherein said plurality of magnets of said magnet ring are uniformly distributed along only a first portion of said circle.

5. The system of claim 4, wherein a remaining portion of said circle other than said first portion has none of said magnets associated therewith.

6. In a plasma sputter reactor having a pedestal arranged around a central axis for supporting a substrate to be sputter coated, a sputtering source comprising:
   a sputtering target opposed to said pedestal along said central axis, formed of a material to be sputter coated on said substrate, and having formed therein an outer sidewall and an inner sidewall extending parallel to said central axis and a roof bridging an area between said inner and outer sidewalls, an annular vault being formed by said sidewalls and said roof to face said pedestal;
   a roof magnet assembly positioned in back of said roof from said vault, rotatable around said central axis, and comprising an outer pole of first magnetic polarity along said central axis and an inner pole of a second magnetic polarity opposite said first magnetic polarity and surrounded by said outer pole;
   an inner sidewall magnet assembly positioned in back of said inner sidewall from said vault and having said second magnetic polarity; and
   an outer sidewall magnet assembly positioned in back of said outer sidewall from said vault, and comprising a plurality of magnets having said first magnetic polarity, having an asymmetric distribution of magnetic strength around said outer sidewall, and being rotatable with said roof magnet assembly about said central axis.

7. In a plasma sputter reactor having a pedestal arranged around a central axis for supporting a substrate to be sputter coated, a sputtering source comprising:
   a sputtering target opposed to said pedestal alone said central axis, formed of a material to be sputter coated on said substrate, and having formed therein an outer sidewall and an inner sidewall extending parallel to said central axis and a roof bridging an area between said inner and outer sidewalls, an annular vault being formed by said sidewalls and said roof to face said pedestal;
   a roof magnet assembly positioned in back of said roof from said vault, rotatable around said central axis, and comprising an outer pole of first magnetic polarity along said central axis and an inner pole of a second magnetic polarity opposite said first magnetic polarity and surrounded by said outer pole;
   an inner sidewall magnet assembly positioned in back of said inner sidewall from said vault and having said second magnetic polarity, wherein said inner sidewall magnet assembly has a substantially uniform distribution of magnetic strength around said inner sidewall; and
   an outer sidewall magnet assembly positioned in back of said outer sidewall from said vault, having said first magnetic polarity, having an asymmetric distribution of magnetic strength around said outer sidewall, and being rotatable with said roof magnet assembly about said central axis.

8. In a plasma sputter reactor having a pedestal arranged around a central axis for supporting a substrate to be sputter coated, a sputtering source comprising:
   a sputtering target opposed to said pedestal along said central axis, formed of a material to be sputter coated on said substrate, and having formed therein an outer sidewall and an inner sidewall extending parallel to said central axis and a roof bridging an area between said inner and outer sidewalls, an annular vault being formed by said sidewalls and said roof to face said pedestal;
   a roof magnet assembly positioned in back of said roof from said vault, rotatable around said central axis, and comprising an outer pole of first magnetic polarity along said central axis and an inner pole of a second magnetic polarity opposite said first magnetic polarity and surrounded by said outer pole;
   an inner sidewall magnet assembly positioned in back of said inner sidewall from said vault and having said second magnetic polarity; and
   an outer sidewall magnet assembly positioned in back of said outer sidewall from said vault, having said first magnetic polarity, having an asymmetric distribution of magnetic strength around said outer sidewall, and being rotatable with said roof magnet assembly about said central axis, wherein said asymmetric distribution has a weaker magnetic intensity at a first angular location offset from said roof magnet assembly about said central axis by 180° along said outer sidewall than at a second angular location incident with said roof magnet assembly.

9. In a plasma sputter reactor having a pedestal arranged around a central axis for supporting a substrate to be sputter coated, a sputtering source comprising:
   a sputtering target opposed to said pedestal along said central axis, formed of a material to be sputter coated on said substrate, and having formed therein an outer sidewall and an inner sidewall extending parallel to said central axis and a roof bridging an area between said inner and outer sidewalls, an annular vault being formed by said sidewalls and said roof to face said pedestal;
   a roof magnet assembly positioned in back of said roof from said vault, rotatable around said central axis, and comprising an outer pole of first magnetic polarity along said central axis and an inner pole of a second magnetic polarity opposite said first magnetic polarity and surrounded by said outer pole;
   an inner sidewall magnet assembly positioned in back of said inner sidewall from said vault and having said second magnetic polarity; and
   an outer sidewall magnet assembly positioned in back of said outer sidewall from said vault, having said first magnetic polarity, having an asymmetric distribution of magnetic strength around said outer sidewall, and being rotatable with said roof magnet assembly about said central axis, wherein said outer sidewall magnet assembly having a plurality of magnets positioned along a circular band, an angular separation of neighboring ones of said magnets being at least a minimum angular separation, wherein no magnets are present in an arc portion of said circle extending over a plurality of said minimum angular separations.

10. In a plasma sputter reactor having a pedestal arranged around a central axis for supporting a substrate to be sputter coated, a sputtering source comprising:

a sputtering target opposed to said pedestal along said central axis, formed of a material to be sputter coated on said substrate, and having formed therein an outer sidewall and an inner sidewall extending parallel to said central axis and a roof bridging an area between said inner and outer sidewalls, an annular vault being formed by said sidewalls and said roof to face said pedestal;

a roof magnet assembly positioned in back of said roof from said vault, rotatable around said central axis, and comprising an outer pole of first magnetic polarity along said central axis and an inner pole of a second magnetic polarity opposite said first magnetic polarity and surrounded by said outer pole;

an inner sidewall magnet assembly positioned in back of said inner sidewall from said vault and having said second magnetic polarity; and an outer sidewall magnet assembly positioned in back of said outer sidewall from said vault, having said first magnetic polarity, having an asymmetric distribution of magnetic strength around said outer sidewall, and being rotatable with said roof magnet assembly about said central axis, wherein a total magnetic intensity of said outer sidewall magnet assembly is at least four times that of the inner sidewall magnet assembly.

11. In a hollow cathode plasma sputter reactor having a pedestal arranged around a central axis for supporting a substrate to be sputter coated, a sputtering source comprising:

a sputtering target opposed to said pedestal along said central axis, formed of a material to be sputter coated on said substrate, and having formed therein a sidewall extending parallel to said central axis and a roof bridging an area within said sidewall, a cylindrical vault being formed by said sidewall and said roof to face said pedestal along said central axis; and a sidewall magnet assembly positioned in back of said outer sidewall from said vault, having a first magnetic polarity along said central axis, having an asymmetric distribution of magnetic strength around said sidewall, and being rotatable about said central axis.

12. The source of claim 11, further comprising a roof magnet assembly positioned in back of said roof from said vault and comprising an outer pole of a second magnetic polarity along said central axis and an inner pole of a third magnetic polarity opposite said second magnetic polarity and surrounded by said outer pole.

13. The source of claim 12, wherein said roof magnet assembly is rotatable with said sidewall magnet assembly about said central axis.

14. The source of claim 12, wherein said third magnetic polarity is anti-parallel to said first magnetic polarity.

15. The sputtering source of claim 6, wherein said outer sidewall magnet assembly further comprises at least two support member annular about said central axis and support said plurality of magnets and rotatable therewith.

16. The sputtering source of The system of claim 1, wherein said plurality of magnets has an asymmetric distribution of said positions of said magnets around said circle.

17. The system of claim 1, wherein said asymmetric magnet ring further comprises at least two support rings annular about said central axis outside of said first sidewall.

18. The system of claim 1, wherein said asymmetric distribution comprises an asymmetric distribution of positions of said magnets along said support rings.

19. The sputtering source of claim 11, wherein said sidewall magnet assembly comprises a plurality of magnets azimuthally arranged about said central axis in back of said sidewall.

20. The sputtering source of claim 19, wherein said sidewall magnet assembly further comprises at least one support member annular about said central axis and supporting said plurality of magnets and rotatable therewith.

21. The sputtering source of claim 11, wherein said cylindrical vault is a generally right cylindrical vault.

22. A plasma sputtering target and magnetron system, comprising:

a sputtering target having a generally right cylindrical vault extending about a central axis and defined between on all lateral sides by a sidewall of said target and on an axial side by a roof of said target; and an asymmetric magnetic assembly having a magnetic polarity in a first direction along said central axis, arranged along a circle extending radially outwardly of said sidewall, having an asymmetric distribution of magnetic strength around said circle, and rotatable about said central axis.

23. The system of claim 22, further comprising a nested magnetic assembly disposed on a side of said roof opposite said vault, rotatable about said central axis, and including an inner pole having a magnetic polarity in a second direction opposite said first direction and an outer pole having a magnetic polarity in said first direction and surrounding said inner pole.

* * * * *